United States Patent [19]

Kennon

[11] Patent Number: 4,571,691

[45] Date of Patent: Feb. 18, 1986

[54] WATT-HOUR METER WITH FIBER OPTICS TAMPER DETECTOR

[75] Inventor: Jerry M. Kennon, Raleigh, N.C.

[73] Assignee: Westinghouse Electric Corp., Pittsburgh, Pa.

[21] Appl. No.: 466,808

[22] Filed: Feb. 16, 1983

[51] Int. Cl.⁴ .................. G08B 21/00; G01R 21/06
[52] U.S. Cl. .................. 364/483; 340/870.02; 340/545
[58] Field of Search ............ 364/483; 340/532, 533, 340/534, 541, 542, 545, 507, 641, 870.02, 870.03, 555, 556, 568

[56] References Cited

U.S. PATENT DOCUMENTS

| | | | |
|---|---|---|---|
| 3,938,124 | 2/1976 | Way et al. ............ | 340/568 |
| 4,150,371 | 4/1979 | Scaglione ............ | 340/637 |
| 4,262,284 | 4/1981 | Stieff et al. ............ | 340/542 |
| 4,327,362 | 4/1982 | Hoss ............ | 340/870.02 |
| 4,329,681 | 5/1982 | Parsons ............ | 340/533 |
| 4,337,466 | 6/1982 | Spahn ............ | 340/870.02 |
| 4,357,601 | 11/1982 | McWilliams ............ | 340/870.02 |

Primary Examiner—Felix D. Gruber
Assistant Examiner—Heather R. Herndon
Attorney, Agent, or Firm—William D. Lanyi

[57] ABSTRACT

A watt-hour meter tamper detector characterized by a fiber optic link that extends between a microprocessor of a load management terminal and mounting means for maintaining a watt-hour meter cover intact, and which fiber optic link signals an attempted opening of the mounting ring to the microprocessor when the fiber optic link is severed.

11 Claims, 6 Drawing Figures

WATT-HOUR METER WITH FIBER OPTICS TAMPER DETECTOR

BACKGROUND OF THE INVENTION

1. Field of the Invention

This invention relates to a tamper-resistant enclosure for a watt-hour meter, and, more particularly, to such an enclosure having a fiber optic link together with a load management terminal for remotely discovering unauthorized access to the watt-hour meter.

2. Description of the Prior Art

Watt-hour meters are employed for billing registrations of the electric power consumed at the customer location. Typically, the meters are self-contained, detachable meter units including a removable, pluggable base assembly and a cup-shaped cover that is normally detachably mounted on the base assembly to form a watt-hour meter enclosure.

To increase the efficiency and lower the cost of supplying and distributing electric energy to thousands of individual customer of an electric utility company, load management terminals (LMT) have been provided for connection at each of the customer locations for providing reliable and low-cost communication links to the utility company. For a more complete understanding of a load management terminal, reference is made to U.S. Pat. No. 4,130,874. Suffice it to say, the LMT includes a communication receiver and transmitter for coupling the LMT with a central station through a communication link, such as provided by a power line communication system.

Heretofore, the prior art has not disclosed the employment of the LMT with security means for discovering any tampering or unauthorized access to the watt-hour meter housing for any reason whatsoever. One reason for that has been that the tamper-resistant devices of the prior art have been of a mechanical nature, rather than electrical or electronic.

SUMMARY OF THE INVENTION

In accordance with this invention, apparatus is provided for indicating the occurrence of tampering with an electrical energy meter installation which comprises watt-hour meter means together with mounting means for receiving the meter means and for electrically connecting the meter means to an associated electrical circuit being monitored, and means for securing the meter means to the mounting means are provided. A fiber optic link is connected to the securing means, whereby operation of the securing means sufficient to permit electrical disconnection of the meter means from the associated circuit being monitored is operative to cause severance of the fiber optic link. For that purpose, electronic means are electrically connected to the meter means for performing energy measurements and control functions in association with the meter means; and the electronic means has an input terminal connected to the fiber optic link such that severance of the link generates a signal within the electronic means to indicate the occurrence of tampering.

The advantage of the device of the present invention is that it provides tamper detector means including a fiber optic link that is suitable for use with load management terminals, whereby tamper detection may be communicated to an electric utility company when it occurs or at a subsequent time during periodic routine survey of customer meters by remote control means by the electric utility company.

DESCRIPTION OF THE PREFERRED EMBODIMENTS

Figure 1:
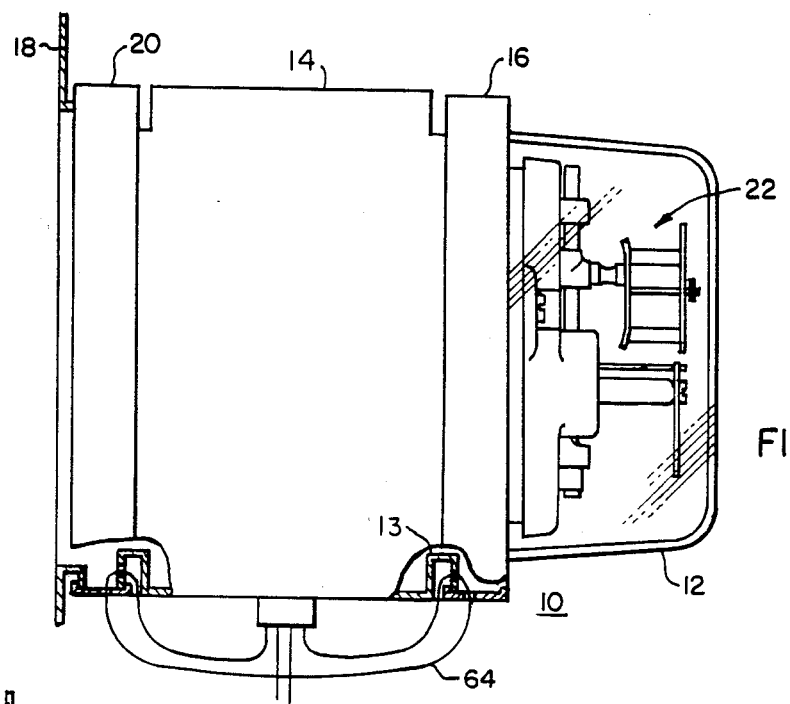
FIG. 1 is an elevational view of a watt-hour meter and LMT unit mounted on a panelboard in accordance with this invention.

A self-contained watt-hour metering apparatus is generally indicated at 10 (FIG. 1) and it comprises a cover 12 and an auxiliary equipment enclosure unit or load management terminal (LMT) 14. The cover 12 is detachably mounted in a socket 13 on the unit 14 by securing means such as a detachable mounting ring 16. The enclosure unit 14 likewise may be mounted in place on a panelboard 18 by securing means such as a mounting ring 20.

The cover 12 is a suitable molded cup-shaped member composed of either glass or a polycarbonate plastic and encloses a watt-hour meter movement 22 in a conventional manner. The cover 12 (FIG. 2) includes a closed front end 24 and a rear open end 26 where a circular mounting flange 28 extends radially outwardly to define the outer periphery of the rear open end of the cover 12. When the cover 12 is attached at the flange 28 to the enclosure unit 14, the meter movement 22 (FIG. 1) is enclosed within the protective chamber of the cover 12.

The auxiliary equipment enclosure unit 14 is an annular unit comprised of a dielectric material, such as a plastic, and encloses a pair of terminal extensions 30 as well as an electronic unit 32. Thus, the enclosure unit 14 is intended to carry auxiliary equipment, by way of example and not limitation, formed by a remote power line communications terminal referred to as a load management terminal (LMT), such as described and claimed in U.S. Pat. No. 4,130,874. To facilitate mounting of the cover 12 onto the enclosure unit 14, the latter is provided with a mounting flange 34. Likewise, a mounting flange 36 may be provided at the opposite side of the unit 14. The cover 12 with the watt-hour meter unit 22 is mounted onto the unit 14. Blade terminals 38 extend through a base 39, covering the open end 26, and engage jaw terminals 40 at one end of the terminal extensions 30. When the enclosure unit 14 is mounted on the panelboard 18, the other ends of the terminal extensions 30 engage similar jaw terminals 42 of current supply conductors 44, 46.

The watt-hour meter movement 22 includes a pulse initiator (not shown), such as described in U.S. Pat. No. 3,943,498, which produces a train of electrical pulses at a rate proportional to the consumption of electrical energy. The output of the pulse initiator is coupled by a conductor 48 (FIG. 2) to the electronic unit 32 of the load management terminal (LMT) which comprises the enclosure unit 14, the terminal extensions 30, and the electronic unit 32, in a manner described in U.S. Pat. No. 4,130,874, to provide metering pulses to the electronic unit. The electronic unit is also connected by conductors 50, 52 to circuit breakers 54, 56, respectively, of a customer load center for the purpose of energizing and de-energizing interruptible loads, such as a water heater 58 and air-conditioner 60, in response to a load control command received by the LMT from the electric utility control location over a communication channel such as the powerline. Moreover, the electronic circuitry or unit 32 of the LMT includes a microprocessor 62 (FIG. 3), as described in said U.S. Pat. No. 4,130,874, for performing the load management functions also described in that patent.

Figure 3:
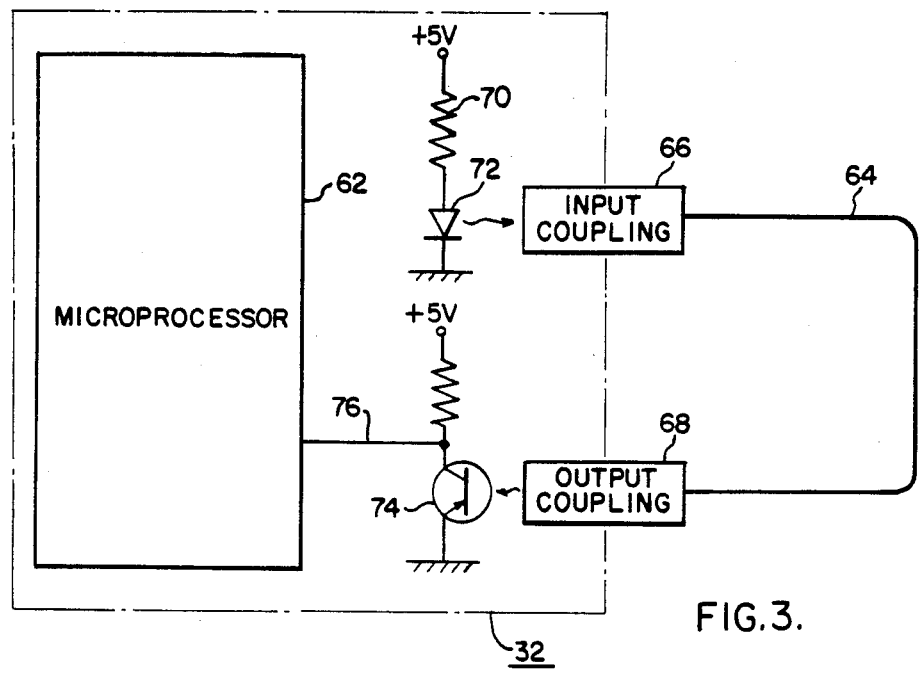
FIG. 3 is a schematic view showing the manner in which a fiber optic link is electrically connected to a current supply and to a microprocessor.
Figure 4:
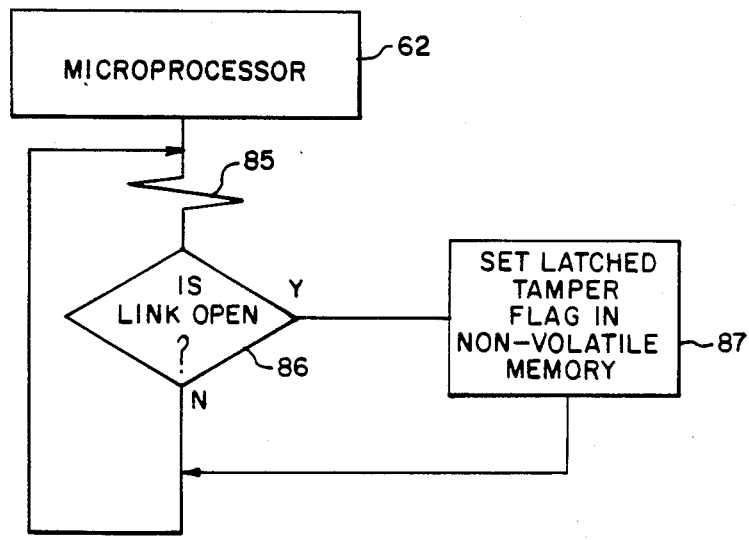
FIG. 4 is a flow chart showing a microprocessor program.

In accordance with this invention, the electronic unit 32 also comprises a fiber optic link including a fiber optic conductor 64, an input coupling 66, and output coupling 68. When the apparatus is energized, a 5-volt supply (FIG. 3) having a load resistor 70 illuminates a light-emitting diode (LED) 72 so that the illumination passes through the input coupling 66, the fiber optic conductor 64, and the output coupling 68. Light from the output coupling 68 operates a phototransistor 74 (FIG. 3) to a fully conductive condition, placing an input port terminal 76 of the microprocessor 62 at low potential. If the fiber optic conductor 64 is broken, no light is supplied to the phototransistor 74 and the phototransistor 74 is operated to the nonconductive condition, thereby placing the input port terminal 76 at high potential. The flow chart of FIG. 4 shows a logic flow diagram of instructions stored in program memory of the microprocessor 62 to perform the present invention. Included in the main program instruction sequence 85 is inserted the tamper detect instruction sequence 86, 87. The instruction sequence 86 tests the logic level of the tamper input port terminal 76. If the logic level is high, indicating the link or conductor 64 is broken, the microprocessor 62 will perform instruction sequence 87 which sets a temper indication in the nonvolatile (data not lost during power outages) portion of the microprocessor 62 data storage memory. If the logic level is low, indicating the link or conductor 64 is intact, the microprocessor 62 will skip the tamper indication set instruction sequence. Accordingly, any attempt to tamper with the watt-hour meter is detected and saved. Such tamper indication is transmitted on the communication channel to the electric utility control location. At initial installation and after the tamper indication has been read by the electric utility control location, the tamper indication may be reset or cleared by a reset command transmitted from the electric utility control location.

Figure 2:
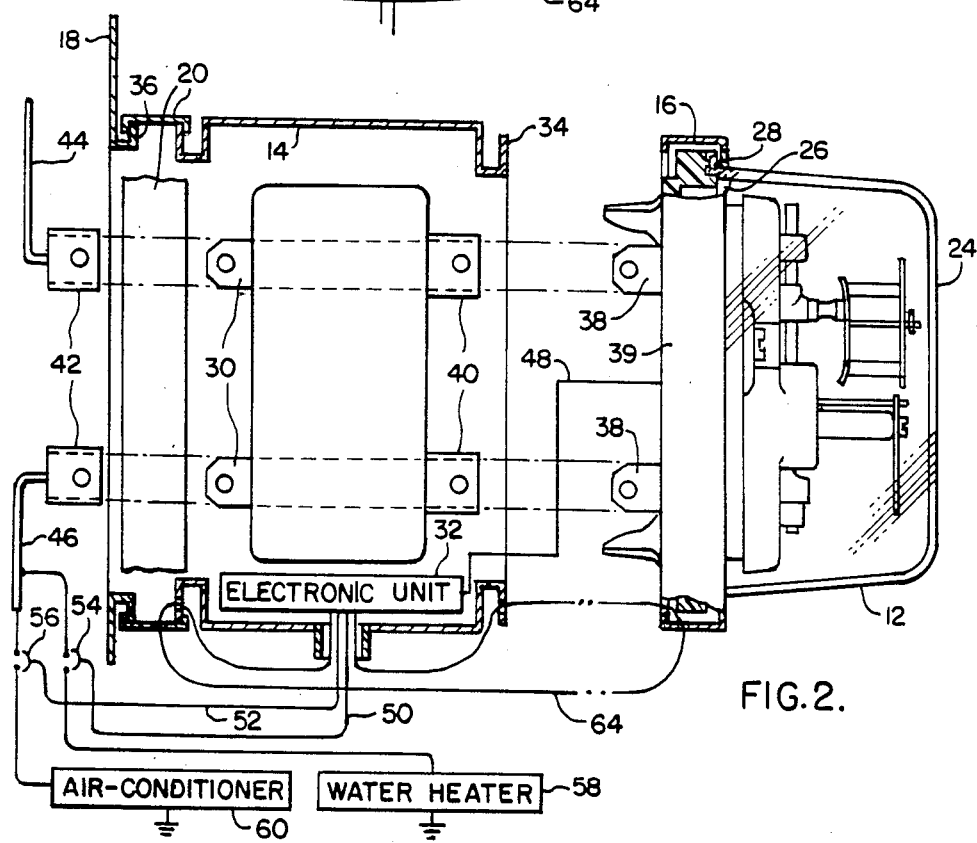
FIG. 2 is a partially schematic view of the watt-hour meter, the LMT, and the panelboard.
Figure 5:
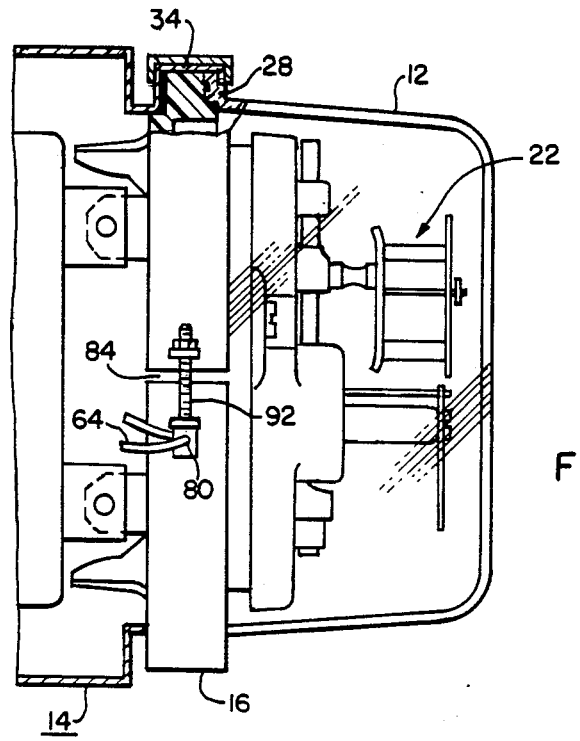
FIG. 5 is a view of a ring for mounting a cover on a watt-hour meter base.

As shown in FIG. 2, the elongated fiber optic conductor or link passes through opening means in or associated with the rings 16, 20. Either or both rings 16, 20 may be used for this purpose. The fiber optic link or conductor 64 extends through an opening, or eyelet, 80 (FIG. 5) in a tightening screw 92 for securing the mounting ring 16 in place, the ring being a discontinuous member having a break at 84. If tampering or an unauthorized access to the meter 22 is attempted by unscrewing the tightening screw 92, the fiber optic link is broken; or, the input and output couplings 66, 68 are pulled out of their installed positions in the LMT, the couplings being the so-called push-in/no-pull-out type. Whenever the light circuit is broken, either by breakage of the fiber optic conductor 64 or the removal of one or more couplings 66, 68, the tamper indication in the nonvolatile memory of the microprocessor 62 is set.

Figure 6:
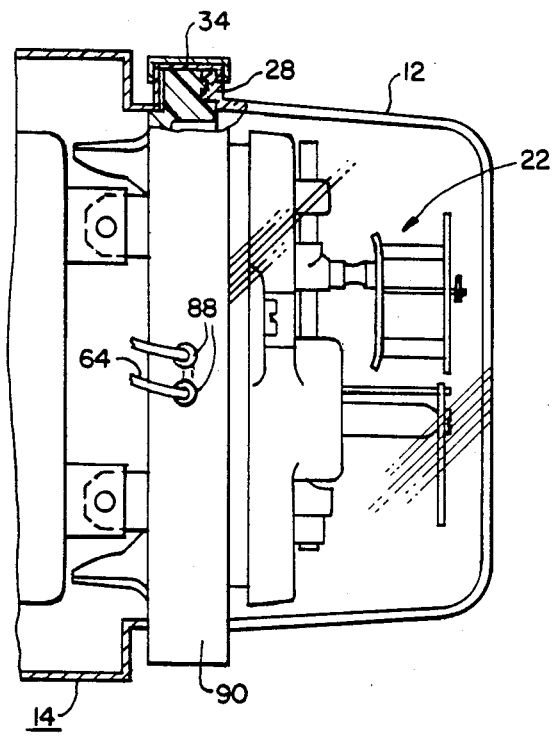
FIG. 6 is another embodiment of a ring for mounting the cover on a watt-hour meter base.

In another embodiment (FIG. 6), another type of ring 90 may be used instead of the ring 16. The ring 90 having an C-shaped cross section, is of a conventional structure and is a continuous, circular member having the so-called bayonet-type latching means in conjunction with a mounting flange 34. Inasmuch as the ring 90 is devoid of a tightening screw, such as the screw 92 on the ring 16, the mounting ring 90 may be provided with a pair of apertures 88 through which the fiber optic conductor or link 64 is threaded, so that any attempt to demount the cover 12 by rotating the mounting ring 86 results in either severance of the fiber optic link, or withdrawal of one or both couplings 66, 68 from their installed positions.

Accordingly, the apparatus of this invention provides tamper detector means including a fiber optic link which, if interrupted, signals a microprocessor which sets an alarm indication, or tamper flag, in nonvolatile memory, whereby tamper detection is communicated to a central station on the first poll of the terminal.

What is claimed is:

1. Apparatus for indicating the occurrence of tampering with an electrical energy meter installation, the apparatus comprising:
    watt-hour meter means having a protective cover;
    mounting means for receiving the meter means and for electrically connecting the meter means to an associated electrical circuit being monitored;
    means for securing the protective cover to the mounting means;
    a fiber optic link connected to the securing means such that operation of the securing means sufficient to permit relative movement between the cover and the mounting means is operative to cause severance of the fiber optic link;
    electronic means electrically connected to the meter means for performing energy measurement and control functions in association with the meter means; and
    the electronic means having an input terminal connected to the fiber optic link such that severance of the link generates a signal within the electronic means to indicate the occurrence of tampering said signal being retainable within said apparatus.

2. The apparatus of claim 1 in which the securing means comprises a detachable mounting ring means to which the fiber optic link is connected.

3. The apparatus of claim 2 in which the mounting ring means includes aperture means through which the link passes.

4. The apparatus of claim 3 in which the mounting ring means includes a ring mounting screw having a hole through which the link passes.

5. The apparatus of claim 4 in which the link comprises opposite ends, one of said ends being coupled to an associated light source and the other of said ends being terminated at the input terminal.

6. The apparatus of claim 5 in which one end of the link is connected to a light-emitting diode and the other end is connected to a photodetector, whereby interruption of the fiber optic light is detected by the photodetector.

7. The apparatus of claim 6 in which the electronic means is a load management terminal.

8. The apparatus of claim 7 in which the load management terminal is connected to current supply conductor means and the meter is mounted in the load management terminal.

9. The apparatus of claim 8, further comprising a microprocessor.

10. The apparatus of claim 9 in which the microprocessor comprises a nonvolatile memory.

11. The apparatus of claim 10 in which the nonvolatile memory comprises a tamper flag.

* * * * *